US012615706B2

(12) United States Patent
Tam et al.

(10) Patent No.: US 12,615,706 B2
(45) Date of Patent: Apr. 28, 2026

(54) APPROACH TO INCREASE LINAC OPERATING RANGE OF LINEAR ACCELERATOR

(71) Applicant: Applied Materials, Inc., Santa Clara, CA (US)

(72) Inventors: Wai Ming Tam, Georgetown, MA (US); Jeffrey Laurence Klein, Methuen, MA (US); Frank Sinclair, Hartland, ME (US)

(73) Assignee: Applied Materials, Inc., Santa Clara, CA (US)

( * ) Notice: Subject to any disclaimer, the term of this patent is extended or adjusted under 35 U.S.C. 154(b) by 60 days.

(21) Appl. No.: 18/818,022

(22) Filed: Aug. 28, 2024

(65) Prior Publication Data

US 2026/0068027 A1    Mar. 5, 2026

(51) Int. Cl.
H05H 9/04 (2006.01)
H01J 37/08 (2006.01)
(Continued)

(52) U.S. Cl.
CPC .............. H05H 9/047 (2013.01); H05H 7/02 (2013.01); H05H 7/14 (2013.01); H05H 7/22 (2013.01);
(Continued)

(58) Field of Classification Search
CPC .. H05H 7/22; H05H 7/02; H05H 9/00; H05H 2007/025; H05H 7/18; H05H 2277/12;
(Continued)

(56) References Cited

U.S. PATENT DOCUMENTS

| | | | |
|---|---|---|---|
| 4,667,111 A | 5/1987 | Glavish et al. | |
| 6,208,095 B1 | 3/2001 | Divergilio et al. | |
| (Continued) | | | |

FOREIGN PATENT DOCUMENTS

| | | |
|---|---|---|
| CN | 117293006 A | 12/2023 |
| JP | 2010147045 A | 7/2010 |
| KR | 20210125413 A | 10/2021 |

OTHER PUBLICATIONS

International Search Report and Written Opinion for International Application No. PCT/US2025/039218, mailed on Nov. 23, 2025, 19 pages.

*Primary Examiner* — Wei (Victor) Y Chan
(74) *Attorney, Agent, or Firm* — KDW, PLLC

(57) ABSTRACT

An ion implanter, including an ion source and extraction system, arranged to generate an ion beam at a first ion energy, and a linear accelerator, arranged to accelerate the ion beam to a second ion energy, wherein the linear accelerator comprises a plurality of acceleration stages coupled to receive a plurality of RF signals from a plurality of power assemblies, respectively. The linear accelerator may be configured wherein at least one stage of the plurality of acceleration stages is coupled to: reversibly connect to a first power assembly, comprising a resonator that contains a resonator enclosure, the first power assembly generating a first RF signal at a first frequency; to disconnect from the first power assembly; and to connect to a second power assembly, generating a second RF signal at a second frequency, greater than the first frequency, while not changing the resonator enclosure.

20 Claims, 5 Drawing Sheets

(51) Int. Cl.
    *H01J 37/317*       (2006.01)
    *H05H 7/02*        (2006.01)
    *H05H 7/14*        (2006.01)
    *H05H 7/22*        (2006.01)

(52) U.S. Cl.
    CPC ............ *H05H 9/042* (2013.01); *H05H 9/045*
        (2013.01); *H01J 37/08* (2013.01); *H01J*
     *37/3171* (2013.01); *H05H 2007/025* (2013.01);
                *H05H 2007/222* (2013.01)

(58) Field of Classification Search
    CPC .... H05H 2007/222; H05H 7/04; H05H 9/042;
                  H05H 9/04; H05H 7/08
    See application file for complete search history.

(56)               References Cited

U.S. PATENT DOCUMENTS

| | | | | |
|---|---|---|---|---|
| 9,472,385 | B2 * | 10/2016 | Makarov ............... | H01J 49/022 |
| 2021/0249222 | A1 * | 8/2021 | Jen .......................... | H01J 37/05 |

* cited by examiner

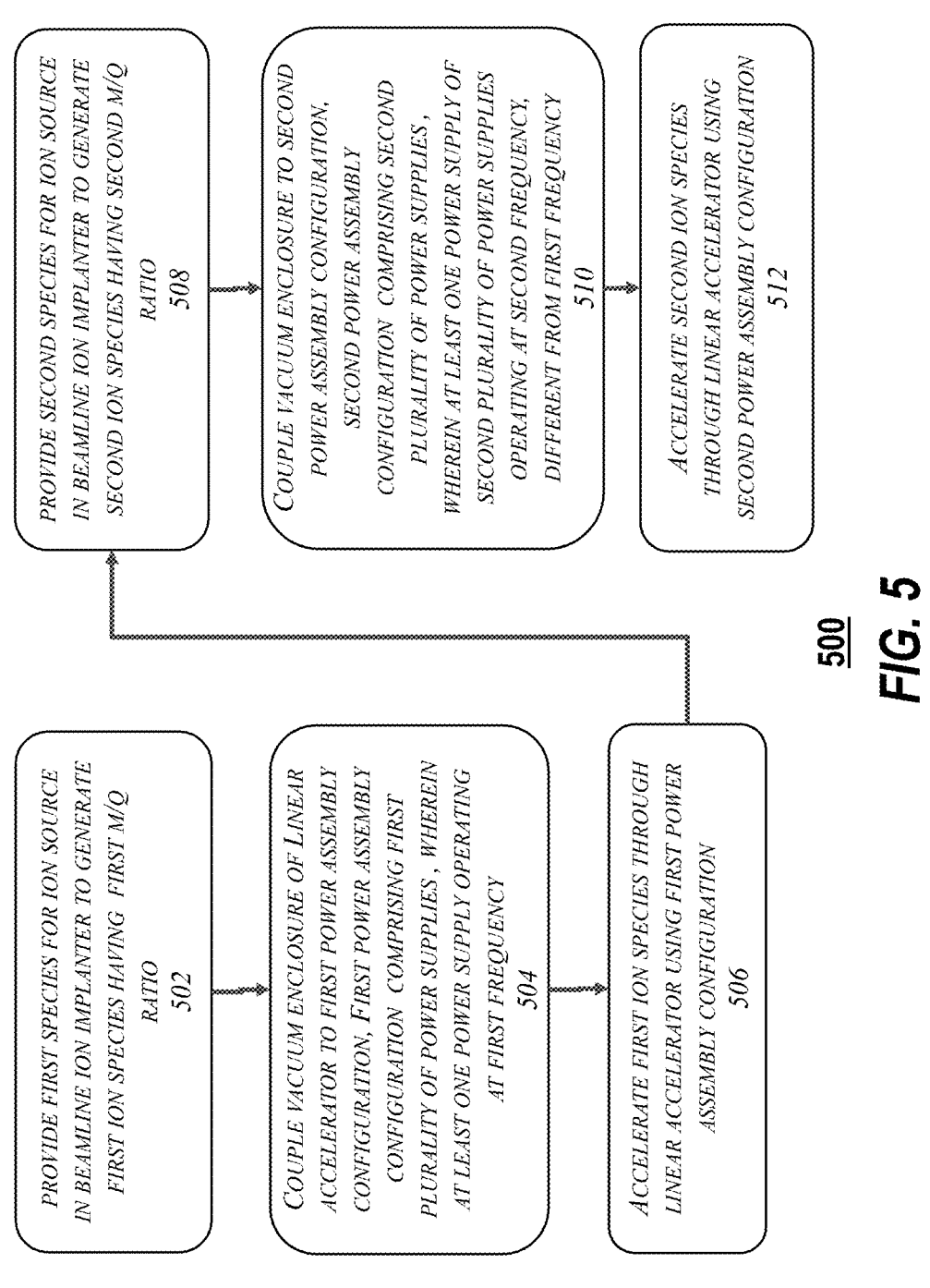

PROVIDE FIRST SPECIES FOR ION SOURCE IN BEAMLINE ION IMPLANTER TO GENERATE FIRST ION SPECIES HAVING FIRST M/Q RATIO
502

COUPLE VACUUM ENCLOSURE OF LINEAR ACCELERATOR TO FIRST POWER ASSEMBLY CONFIGURATION, FIRST POWER ASSEMBLY CONFIGURATION COMPRISING FIRST PLURALITY OF POWER SUPPLIES, WHEREIN AT LEAST ONE POWER SUPPLY OPERATING AT FIRST FREQUENCY
504

ACCELERATE FIRST ION SPECIES THROUGH LINEAR ACCELERATOR USING FIRST POWER ASSEMBLY CONFIGURATION
506

PROVIDE SECOND SPECIES FOR ION SOURCE IN BEAMLINE ION IMPLANTER TO GENERATE SECOND ION SPECIES HAVING SECOND M/Q RATIO
508

COUPLE VACUUM ENCLOSURE TO SECOND POWER ASSEMBLY CONFIGURATION, SECOND POWER ASSEMBLY CONFIGURATION COMPRISING SECOND PLURALITY OF POWER SUPPLIES, WHEREIN AT LEAST ONE POWER SUPPLY OF SECOND PLURALITY OF POWER SUPPLIES OPERATING AT SECOND FREQUENCY, DIFFERENT FROM FIRST FREQUENCY
510

ACCELERATE SECOND ION SPECIES THROUGH LINEAR ACCELERATOR USING SECOND POWER ASSEMBLY CONFIGURATION
512

APPROACH TO INCREASE LINAC OPERATING RANGE OF LINEAR ACCELERATOR

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp.

Implantation apparatus capable of generating ion energies of approximately 1 MeV or greater are often referred to as high energy ion implanters, or high energy ion implantation systems. One type of high energy ion implanter employs a so-called tandem acceleration architecture where ions are accelerated through a first column to high energy, undergo charge exchange to change polarity, and then are accelerated to a second energy, approximately double the first energy in a second column. Another type of high energy ion implanter is termed a linear accelerator, or LINAC, where a series of electrodes arranged as tubes conduct and accelerate the ion beam to increasingly higher energy along the succession of tubes, where the electrodes receive an AC voltage signal. Standard LINACs are driven by a 13.56 MHz signal using a resonator circuit including coil and capacitor. Overall, standard LINACs employing 13.56 MHz resonators employ many accelerator stages and accordingly many resonators to accelerate an initially low energy ion beam to a target ion energy Acceleration of ions in an RF-LINAC takes place by conducting packetized 'bunches' of ions through a series of powered hollow electrodes, which electrodes may be referred to as "drift tubes." An RF signal applied by a resonator assembly to a powered drift tube causes the potential at a given powered drift tube to vary in a regular periodic manner, according to the amplitude of the voltage from the RF signal. Ideally, as an ion bunch emerges from a given drift tube, the instantaneous potential at the given drift tube will be such that the potential difference between the given drift tube and a downstream drift tube, adjacent to the given drift tube, will be at a maximum. Thus, the emerging ion bunch will experience a maximum accelerating field across a gap between the given electrode and the downstream electrode. This occurrence of the maximum accelerating field may generally correspond to the instant when the RF voltage reaches a maximum potential. Accordingly, the length of the drift tubes within a given LINAC are constructed so that ion bunches generally experience a high accelerating field when emerging from a given drift tube.

Note that ions of different mass (m) and/or different mass-to-charge ratios (m/q) will be conducted at different velocities under the same accelerating field. Accordingly, for the same applied voltages in the accelerating stages, ion bunches will travel at velocities that are dependent upon the m/q ratio of the ion bunches. Thus, for the same applied voltages in a LINAC, differing ion species will traverse drift tubes at different speeds. Because, the frequency of the acceleration voltage is fixed, ion bunches formed from differing m/q ratios will emerge from drift tubes at differing times relative to an RF cycle, so that the amplitude of the accelerating voltage experienced by the differing ion species may vary. Nevertheless, by careful construction of drift tube assemblies in a LINAC, present day LINACs may provide a relatively constant amount of acceleration for differing ions over a relatively narrow range. However, outside of this range of m/q ratios that may impart a relatively similar maximum energy to ions, the maximum achievable energy may decrease markedly.

To address the above problem, in some recent approaches, drift tubes may be designed with a variable length that allows the drift tube length to be changed to accommodate for different ion velocities associated with different m/q ratios. In this manner, the efficiency of accelerating ions may be expanded to cover a larger range of ion species that cover a larger m/q range. This latter approach entails relatively complex design considerations, however.

With respect to these and other considerations, the present disclosure is provided.

BRIEF SUMMARY

In one embodiment, an ion implanter is provided. The ion implanter may include an ion source and extraction system, arranged to generate an ion beam at a first ion energy; and a linear accelerator, the linear accelerator being arranged to accelerate the ion beam to a second ion energy, greater than the first ion energy. As such, the linear accelerator may include a plurality of acceleration stages that are coupled to receive a plurality of RF signals from a plurality of power assemblies, respectively. The linear accelerator may be configured wherein at least one stage of the plurality of acceleration stages is coupled to reversibly connect to a first power assembly, comprising a resonator that contains a resonator enclosure, the first power assembly generating a first RF signal at a first frequency. The at least one stage may be coupled to disconnect from the first power assembly, and to connect to a second power assembly, generating a second RF signal at a second frequency, greater than the first frequency, while not changing the resonator enclosure.

In another embodiment, a linear accelerator is provided, for use in an ion implanter. The linear accelerator may include a vacuum enclosure, arranged to contain an ion beam a plurality of drift tube assemblies, arranged within the vacuum enclosure, wherein a given drift tube assembly of the plurality of drift tube assemblies defines a given acceleration stage of a plurality of acceleration stages of the linear accelerator. The linear accelerator may include a plurality of quadrupoles, arranged within the vacuum enclosure, wherein a given quadrupole is arranged at the given acceleration stage of the linear accelerator; and an interface for coupling to a set of external power assemblies, at the plurality of acceleration stages. As such, at least one acceleration stage may be arranged to reversibly connect to a first power assembly, comprising a resonator that contains a resonator enclosure, the first power assembly generating an RF signal at a first frequency. The at least one acceleration stage may be further arranged to disconnect from the first power assembly, and to connect to a second power assembly, generating a second RF signal at a second frequency, greater than the first frequency, while not changing the resonator enclosure.

In another embodiment, a method of operating an ion implanter is provided. The method may include accelerating a first ion species through an RF linear accelerator using a first power assembly configuration, switching the RF linear accelerator to a second power assembly configuration; and accelerating a second ion species through the RF linear accelerator using the second power assembly configuration. As such the first power assembly configuration may comprise a first power assembly, comprising a resonator that includes a resonator enclosure, the first power assembly generating an RF signal at a first frequency. The second power assembly configuration may comprise a second power assembly, generating a second RF signal at a second frequency, greater than the first frequency, wherein the RF linear accelerator is switched from the first power assembly configuration to the second power assembly configuration, without changing the resonator enclosure.

BRIEF DESCRIPTION OF THE DRAWINGS

FIG. 5 depicts an exemplary process flow according to some embodiments of the disclosure.

Figure 1:
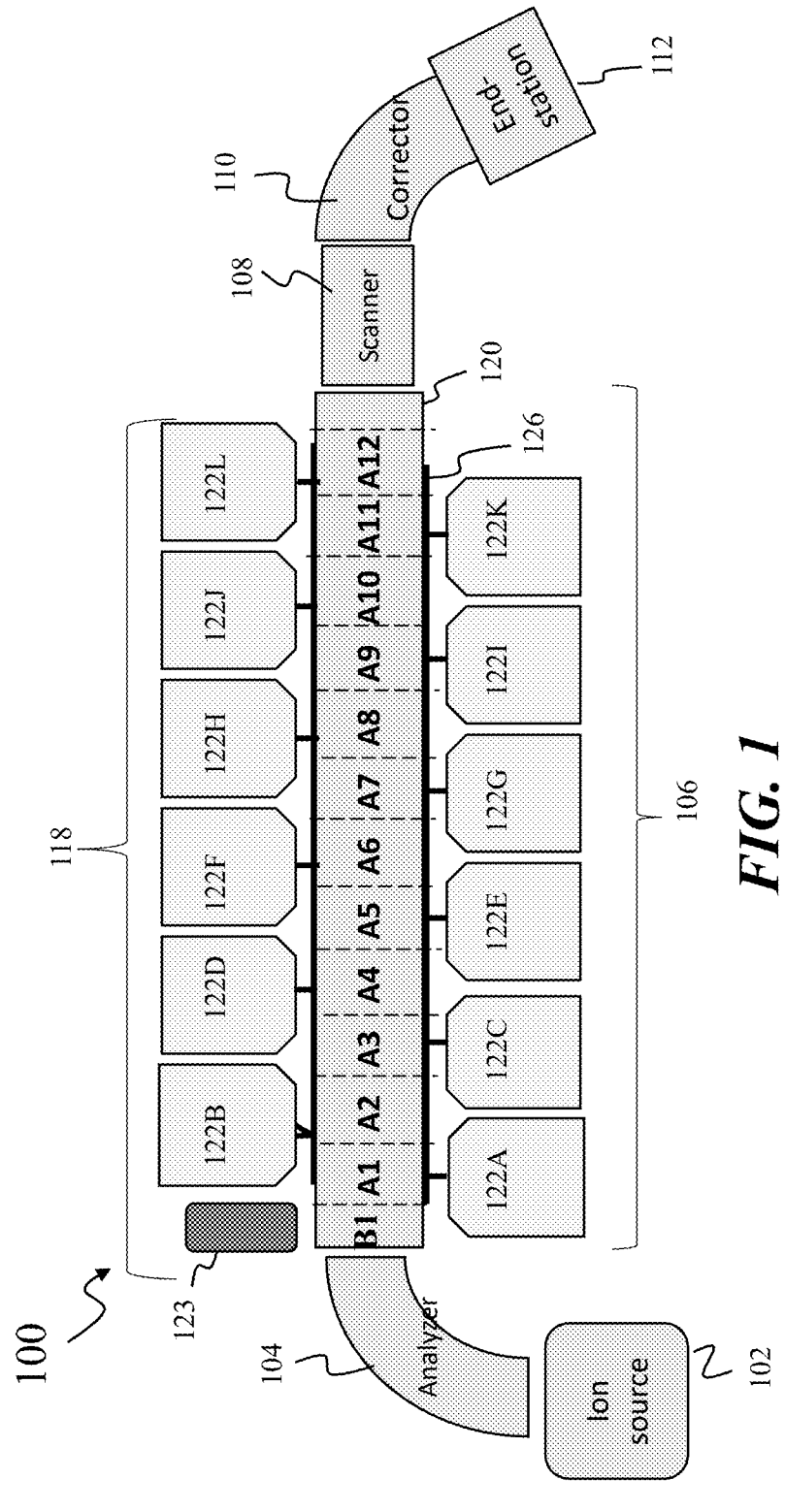
FIG. 1 shows an exemplary ion implanter in a first configuration.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems, based upon a beamline architecture. For brevity, an ion implantation system may also be referred to herein as an "ion implanter." Various embodiments provide novel configurations for providing the capability of generating high energy ions, where the final ion energy delivered to a substrate may be 1 MeV or greater. One aspect of embodiments of the present disclosure is a novel linear accelerator architecture for a high energy ion implanter that provides adjustability in power supply arrangements that are applied to a linear accelerator backbone.

Referring now to FIG. 1, an exemplary ion implanter 100 is shown in block form. The ion implanter 100 may represent a beamline ion implanter, with some elements not shown for clarity of explanation. The ion implanter 100 may include an ion source 102, an analyzer 104, as known in the art. The ion implanter 100 may represent a high energy ion implanter that is design to accelerate ions of a targeted ion species to a relatively higher energy, such as greater than 500 keV, greater than 1 MeV, or greater than 1.5 MeV. According to various embodiments of the disclosure, the ion implanter 100 may be designed to efficiently generate high energy ion beams for ion species over a large mass range, such as from protons up to m/q ratios of 20 or more. In addition to a linear accelerator 106, the ion implanter 100 may include a scanner 108, corrector 110, and end station 112, as known in the art. The linear accelerator 106 may include a vacuum enclosure 120 that encloses multiple internal components, such as drift tubes and quadrupoles (not separately shown) as known in the art. The vacuum enclosure 120 may form a backbone of the linear accelerator 106, such that the vacuum enclosure is adapted to accommodate multiple external components that drive external signals to be applied to drift tubes and quadrupoles, for example. In various embodiments of the disclosure, the vacuum enclosure 120 is adapted so that different types of power supply assemblies may be externally connected to the linear accelerator 106, without changing internal components of the linear accelerator 106. In this manner, the configuration of power supply assemblies that are attached to the vacuum enclosure can be tailored according to the ion implantation requirements for a given application.

As depicted in FIG. 1, the linear accelerator 106 may be characterized by a plurality of acceleration stages. Merely for the purposes of illustration, these stages are shown as A1, A2, A3, A4, A5, A6, A7, A8, A9, A10, A11, and A12, indicating 12 different acceleration stages, while in other embodiments, a linear accelerator may include fewer or a larger number of acceleration stages.

A given acceleration stage may be characterized by a set of electrodes that are arranged inside the vacuum enclosure 120 as a series of drift tubes that conduct an ion beam therethrough. For example, a double gap acceleration stage may include one powered drift tube that is coupled to receive an RF signal from an RF power supply, as well as a pair of grounded drift tubes, as known in the art. A triple gap acceleration stage may include two powered drift tubes, adjacent to one another, as well as a pair of grounded drift tubes, and so forth.

A given acceleration stage may further include a quadrupole element (not separately shown) that is used to focus/steer the ion beam as the ion beam moves through the linear accelerator 106. As further depicted in FIG. 1, the linear accelerator 106 may include a buncher B1, which component includes a drift tube assembly, similar to the acceleration stages. The buncher B1 is arranged to receive an ion beam as a continuous ion beam and to output the ion beam as a bunched ion beam that is further processed by the acceleration stages, disposed downstream of the buncher B1.

Within the vacuum enclosure 120, the various drift tubes of the different acceleration stages are arranged to efficiently accelerate an ion beam therethrough by applying a set of RF signals to the respective powered drift tubes. As shown in FIG. 1, the linear accelerator 106 is configured with an interface 126 so that a given acceleration stage is configurable to couple to a desired power assembly that is disposed outside of the vacuum enclosure. A given acceleration stage of the linear accelerator 106 is powered by a dedicated power assembly. Thus, the acceleration stage A1 is powered by power assembly 122A, acceleration stage A2 is powered by power assembly 122B, acceleration stag A3 is powered by assembly 122C, acceleration stage A4 is powered by power assembly 122D, and so forth. A given power assembly may include an RF power supply that generates an RF power signal at a set frequency, such as 13.56 MHz, as well as a resonator that is operable to receive the RF power signal and convert the RF power signal into an RF voltage signal that is applied to a powered drift tube electrode(s) that is disposed in the given acceleration stage.

Moreover, the buncher B1 may be powered by a power assembly 123, wherein the power assembly 123 includes an RF power supply that generates an RF power signal (which power signal may be referred to herein as a 'buncher RF signal'), at a set frequency (which frequency may be referred to herein as a 'buncher frequency'), such as 13.56 MHz, as well as a resonator that is operable to receive the RF power signal and convert the RF power signal into an RF voltage signal that is applied to a powered drift tube electrode(s) of the buncher B1. In some embodiments, the buncher B1 may constitute two separate bunchers (not separately shown), where a first buncher is powered by a power assembly (such as power assembly 123) at a first frequency, such as 13.56 MHz, while a second buncher, downstream to the first buncher, is powered by a power assembly operating a second frequency, in particular, a harmonic of the first frequency, such as double the first frequency, such as 27.12 MHz. By treating a bunched ion beam output at a given first frequency (such as 13.56 MHz) using a bunching frequency twice that frequency of the given first frequency, the second buncher may output a bunched ion beam having more uniform energy and less spread, for example.

In operation, the different RF voltage signals that are directed to the different acceleration stages of the linear accelerator 106 may be synchronized so that the ion beam bunches that traverse the linear accelerator 106 are accelerated in an efficient manner. Thus, ideally, the different RF power assemblies may be set so that a given ion bunch will experience a maximum accelerating field when traversing between different electrodes of the linear accelerator 106. In principle, the length of the different drift tubes of the linear accelerator 106 may be set to match the phase of the RF signal applied to a given powered drift tube to the position of a given ion bunch of an ion species having a given m/q ratio, so that the ion bunch reaches the end of the drift tube at a phase angle where the RF signal amplitude reaches a maximum. In this manner, a maximum electric field will extend between the given powered drift tube and an adjacent drift tube, when the given ion bunch reaches the acceleration gap between the given powered drift tube and adjacent drift tube. However, due to the finite size of an ion bunch, not all ions within an ion bunch will experience the same accelerating field as the bunch traverses the gap.

Moreover, for ions having a slightly different mass than the targeted mass, the size of the drift tubes of the linear accelerator 106 will not be ideally matched to generate a maximum acceleration, for example. In some examples, for small changes in m/q ratio, the drift tube size for the different drift tubes of the linear accelerator 106 may be designed such that the efficiency of acceleration of ions varies just to a small degree. However, especially for very low mass ions, the changing of m/q ratio may tend to decrease the efficiency of acceleration more dramatically. To address this issue, the linear accelerator 106 is adapted so that different configuration of power assemblies may be applied to the vacuum enclosure 120.

In the power assembly configuration 118 depicted in FIG. 1, the 12 different acceleration stages of the linear accelerator 106 (A1-A12) are powered by a series of power assemblies shown as power assemblies (122A-122L), respectively. In one embodiment, all of these different power assemblies may be fundamentally the same. For example, a given one of the power assemblies (122A-122L) may include a 13.56 MHz RF power supply and a resonator constructed for resonance at that frequency subject to fine tuning. This configuration may be suitable for processing a target ion species of a given m/q value, where the drift tubes and quadrupoles, internal to the vacuum enclosure 120, are designed to efficiently accelerate the target ion species using a 13.56 MHz drive signal applied to each of the acceleration stages. In some examples, the power assembly configuration 118 may be suitable for efficiently accelerating ion species over a range of m/q values, such as between 20-30.

Figure 2:
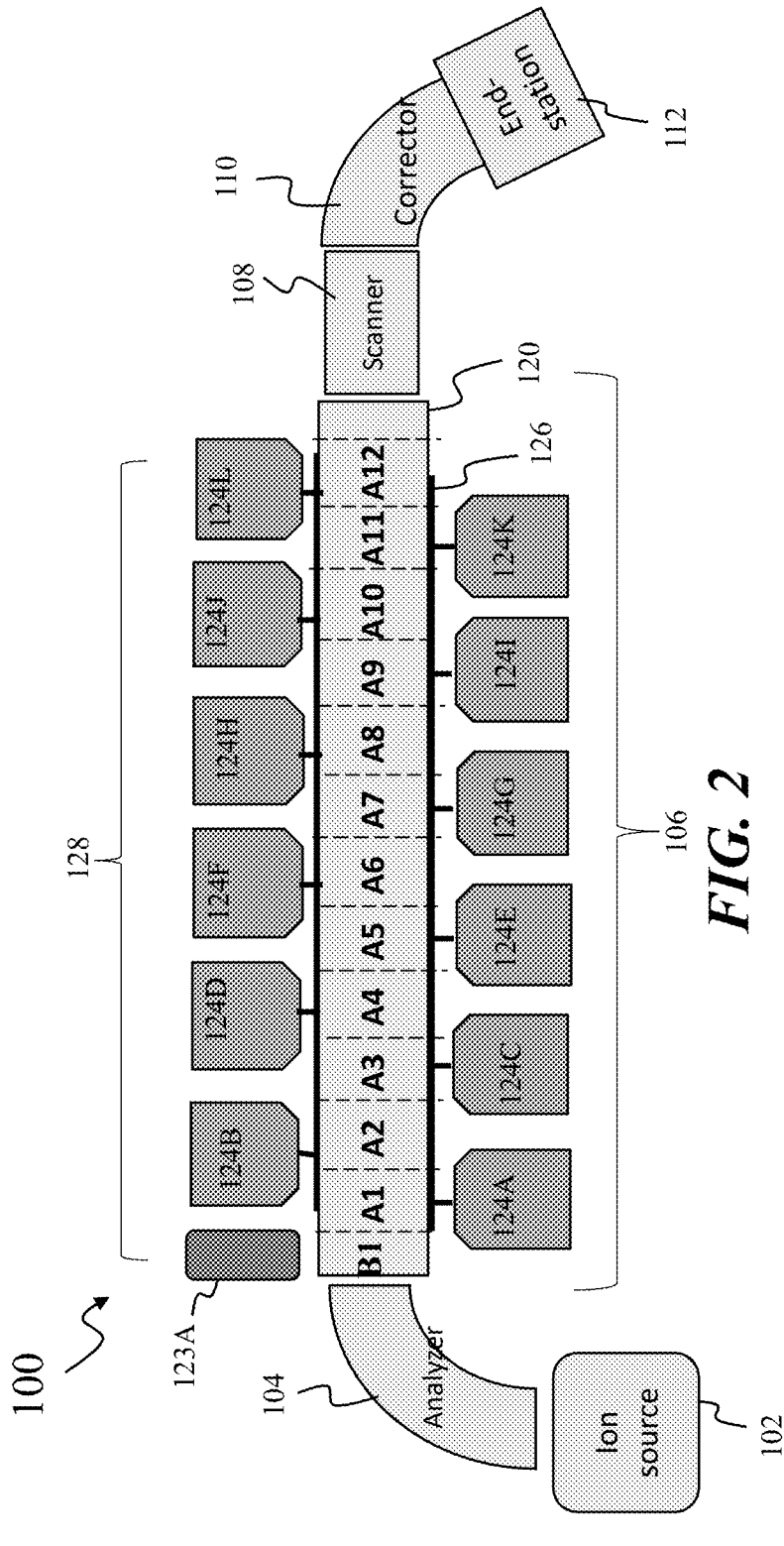
FIG. 2 shows the exemplary ion implanter of FIG. 1 in a second configuration; according to embodiments of the disclosure.

Turning now to FIG. 2, there is shown the ion implanter 100 where a different configuration of linear accelerator 106 is employed, with like elements labeled the same. Thus, the beamline components of ion implanter 100, such as analyzer 104, scanner 108, corrector 110, and end station 112 may be the same for both the configuration of FIG. 1 and FIG. 2. In addition, the internal components of vacuum enclosure 120 may be the same in both FIG. 1 and FIG. 2. Thus, configuration of ion implanter 100 in FIG. 2 differs from the corresponding configuration in FIG. 1 in that a different power assembly is arranged, external to the vacuum enclosure 120. In particular, the power assembly configuration 128 is provided to drive the linear accelerator 106, where the 12 different acceleration stages of the linear accelerator 106 (A1-A12) are powered by a series of power assemblies shown as power assemblies (124A-124L), respectively. In one embodiment, all of these different power assemblies may be the same. For example, each of the power assemblies (124A-124L) may include a 27.12 MHz RF power supply and a resonator constructed for resonance at that frequency. In a further example, each of the power assemblies (124A-124L) may include a 40.68 MHz RF power supply and a resonator constructed for resonance at that frequency. These examples where the power assembly configuration 128 represents power assemblies operating at 27.12 MHz or 40.68 MHz may be especially suitable for processing a designed ion species of a given m/q value, different from the m/q value for ion species that are processed in the configuration of FIG. 1. In particular, the power assembly configuration 128 may be suitable for efficiently accelerating ion species having an m/q value of 10 or lower, including, for example, protons.

In addition, the power assembly configuration 128 of FIG. 2 may include a buncher B1 powered by a power assembly 123A that operates at the same frequency as the power assemblies (124A-124L), such as 27.12 MHz or 40.68 MHz.

In another embodiment, the buncher B1 may be formed of two separate bunchers (not separately shown). In one example, the power assemblies (124A-124L) may be configured to operate at 27.12 MHz, while the a first buncher (not separately shown) of buncher B1 operates at 27.12 MHz, and a second buncher of buncher B1 operates at 54.24 MHz.

Thus, in one scenario, the power assembly configuration 118 may include the power assembly 123 operating at 13.56 MHz, while the power assemblies (122A-122L) also operate at 13.56 MHz, while the power assembly configuration 128 includes the buncher power assembly 123A operating at 27.12 MHz, while the power assemblies (122A-122L) also operate at 27.12 MHz.

In a second scenario where the buncher B1 represents two separate bunchers, the power assembly configuration 118 may include two of the buncher power assemblies 123, one buncher power assembly operating at 13.56 MHz, and a second buncher power assembly operating at 27.12 MHz, while the power assemblies (122A-122L) also operate at 13.56 MHz. In the second scenario, the power assembly configuration 128 includes the buncher B1 having two different bunchers with two different ones of the power assemblies 123A, with a first buncher power assembly operating at 27.12 MHz, while a second buncher power assembly operates at 54.24 MHz, while the power assemblies (122A-122L) operate at 27.12 MHz.

Figure 3:
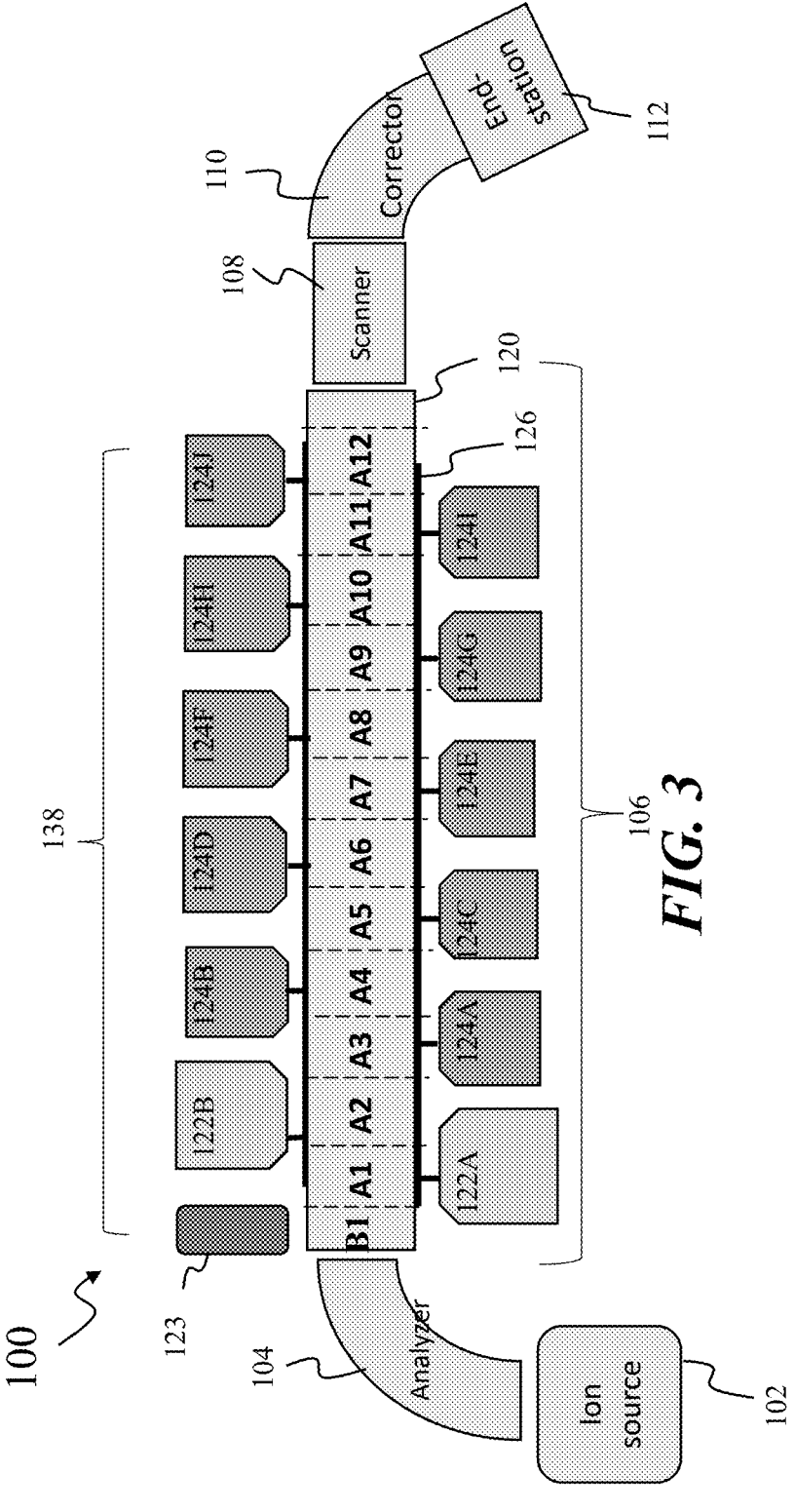
FIG. 3 shows the exemplary ion implanter of FIG. 1 in a third configuration.

In other examples, the configuration of power assemblies that are connected to the vacuum enclosure 120 may include a mix of power assemblies operating at different frequencies. Turning now to FIG. 3, there is shown the ion implanter 100 where a different configuration of linear accelerator 106 is employed, with like elements labeled the same. Thus, the beamline components of ion implanter 100, such as analyzer 104, scanner 108, corrector 110, and end station 112 may be the same for the configuration of FIG. 1, FIG. 2, and FIG. 3. In addition, the internal components of vacuum enclosure 120 may be the same in FIG. 1, FIG. 2, and FIG. 3. Thus, configuration of ion implanter 100 in FIG. 3 differs from the corresponding configurations in FIG. 1 and in FIG. 2 in that a different power assembly configuration is arranged, external to the vacuum enclosure 120. In particular, the power assembly configuration 138 is provided to drive the linear accelerator 106, where the first two acceleration stages of the linear accelerator 106 (A1-A2) are powered by a series of power assemblies shown as power assemblies (122A-12B), respectively, operating at 13.56 MHz, while the next 10 stages of the linear accelerator 106 are powered by a series of power assemblies (124A-12J), operating at a higher frequency, such as 27.12 MHz or 40.68 MHz. This latter power assembly configuration may be applied to more efficiently accelerate a targeted ion species, given the m/q value of the targeted ion species, and the internal configuration of the drift tube assemblies located inside the vacuum enclosure 120.

Note that in some implementations of the linear accelerator 106, the switching of power assemblies may entail switching of a first power supply operating at a first frequency, and a first resonator coupled to that power supply, in favor of a second power supply operating at a second frequency and a second resonator. However, in additional implementations of the linear accelerator 106, the switching of power assemblies that are coupled to a LINAC backbone may be simplified. Note that, as known in the art, a resonator may generally include a resonator coil, a resonator enclosure, an RF driver, a frequency tuner, as well as other accessories, such as cooling. According to the present disclosure, in these additional implementations, the switching of a power assembly may entail just switching of a first power supply and first resonator coil with a second power supply and second resonator coil. In such implementations, components such as the resonator enclosure housing the resonator coil, and well as RF driver component, will not be changed. In particular, the first resonator coil and the second resonator coil would both be designed to work with other components of the resonator, while providing different resonance frequencies. In one particular implementation, a resonator driver may be implemented as loop driver that drives the resonator coil with an RF frequency in a contactless manner. During switching of power assemblies the loop driver need not be switched, nor need the frequency tuner be switched. An advantage of this approach is that the different power assemblies coupled to a LINAC may be switched with substantially less effort and complexity.

Figures 4A, 4B:
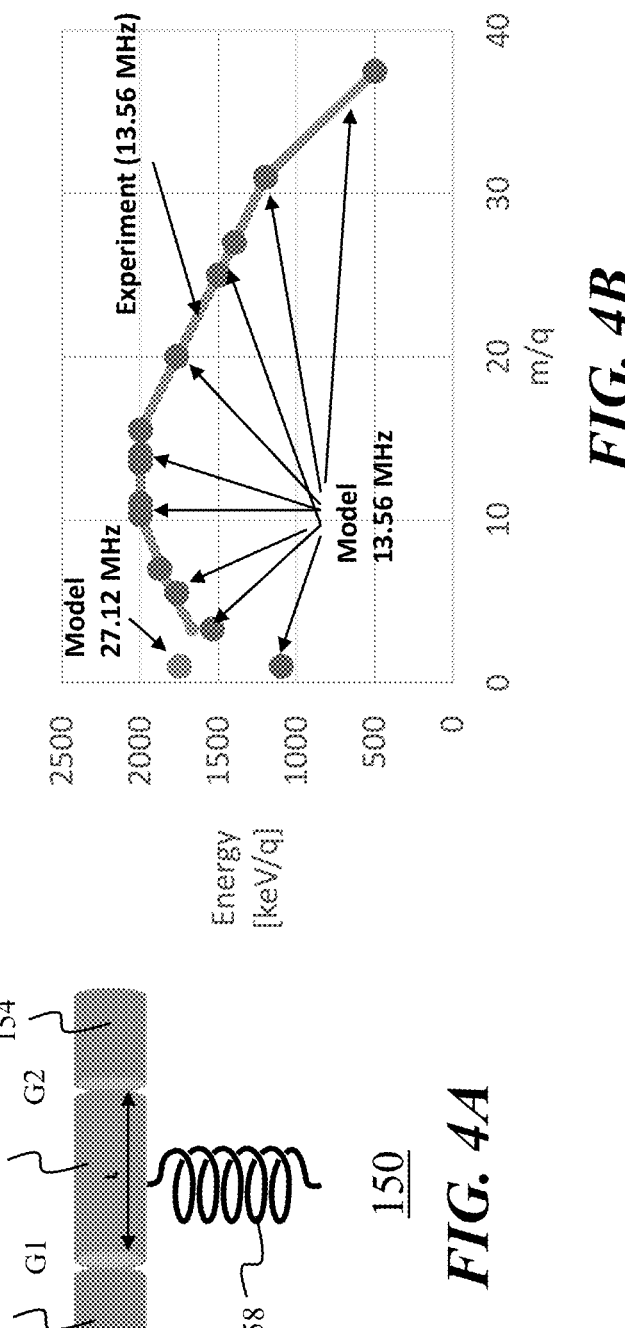
FIG. 4A depicts an exemplary acceleration stage.
FIG. 4B presents a graph plotting experimental data and simulated data for a double gap linear accelerator in a beamline ion implanter, operating at two different frequencies.

Thus, the ion implanter 100 provides a 'platform' for tailoring the power assembly configuration that is assembled to a linear accelerator according to the type of ion species to be processed. The usefulness of this approach may be demonstrated by FIGS. 4A-4B, which figures illustrate the results of simulation of ion processing in a 10-stage linear accelerator. In FIG. 4A there is shown an exemplary acceleration stage, denoted as acceleration stage 150, and represented by a drift tube assembly and an RF power assembly. The drift tube assembly includes a first grounded drift tube 152, second grounded drift tube 154, and a powered drift tube 156, disposed between the first grounded drift tube 152 and the second grounded drift tube 154. The power assembly is represented by a resonator coil 158 is connected on one end to the powered drift tube 156. Thus, the acceleration stage 150 represents a double gap configuration, where a first acceleration gap G1 is formed between the first grounded drift tube 152 and the powered drift tube 156, and a second acceleration gap G2 is formed between the powered drift tube 156 and the second grounded drift tube 154. When traversing the acceleration stage 150, a given ion bunch will be accelerated across the first acceleration gap G1 and additionally accelerated across the second acceleration gap G2. Accordingly, neglecting acceleration with a buncher, an ion bunch will experience acceleration across 20 gaps when traversing a 12-stage LINAC, arranged with double gap acceleration stages as in acceleration stage 150.

FIG. 4B presents a graph plotting experimental data showing the final ion energy of ions after traveling through a 10-stage, double gap linear accelerator in a beamline ion implanter, where the linear accelerator is driven by 13.56 MHz power assemblies, where final ion energy is plotted as a function of m/q ratio. The maximum amplitude of the RF drive voltage is kept constant for the experiments conducted at different ion species having different m/q ratios. The double gap accelerator includes fixed drift tube assemblies where the drift tubes are sized so as to efficiently accelerate ions in a targeted ion range. Additionally, the graph of FIG. 4B depicts a simulated model result for the final ion energy as a function of m/q ratio assuming a RF signal frequency of 13.56 MHz and assuming proper synchronization of RF signals to the different acceleration stages, where the simulated model results show good agreement between model and experimental results. As shown, between m/q values spanning the range of 10 to 16, the final ion energy reaches a maximum plateau of approximately 2000 keV/q. As further depicted in FIG. 4B, at higher m/q ratios and at lower m/q ratio the final ion energy substantially decreases. For example, for protons at m/q=1 the final ion energy is just ~1100 keV/q. FIG. 4B also shows the simulated value for final ion energy when the drift tube assemblies of a 12-stage double gap linear accelerator are coupled to power assemblies operating at 27.12 MHz. In this case, the final ion energy for protons is ~1.8 MHz, showing an improvement of ~66% with respect to the configuration with 13.56 MHz power assemblies.

FIG. 5 presents an exemplary process flow 500. At block 502 a first species is provided for an ion source in a beamline ion implanter. The first species may be suitable gas to generate a first ion species having a first m/q ratio. For example, in one non-limiting embodiment, a suitable gas species is provided to an ion source in order to generate boron (B⁺) ions, having an average m/q ratio of 11.

At block 504, a vacuum enclosure of a linear accelerator is coupled to a first power assembly configuration. The first power assembly configuration may include a first plurality of power supplies, where at least one power supply operates at a first frequency. As an example, a first power assembly configuration in a 12-stage linear accelerator may include 12 power supplies operating to generate RF signals at 13.56 MHz. However, in other embodiments the power supplies may be configured to generate RF signals at a lower or higher frequency.

At block 506, the first ion species is accelerated through the linear accelerator using the first power assembly configuration. In one example, the drift tube electrodes within the linear accelerator may be configured to optimally accelerate ion species having the first m/q ratio using a 13.56 MHz RF voltage applied to the powered drift tubes therein.

At block 508 a second species is provided for an ion source in a beamline ion implanter. The second species may be suitable gas to generate a second ion species having a second m/q ratio. For example, in one non-limiting embodiment, a suitable gas species is provided to an ion source in order to generate hydrogen (H⁺) ions, having an average m/q ratio of 1.

At block 510, the vacuum enclosure of the linear accelerator is coupled to a second power assembly configuration. The second power assembly configuration may include a second plurality of power supplies, where at least one power supply operates at a second frequency. As an example, a second power assembly configuration in a 12-stage linear accelerator may include 12 power supplies operating to generate RF signals at 27.12 MHz.

At block 512, the second ion species is accelerated through the linear accelerator using the second power assembly configuration. As such the second power assembly configuration may be configured to accelerate the second ion species to a higher final energy than a lesser final energy that is achieved when the first power assembly configuration is used to accelerate the second ions.

In view of the foregoing, at least the following advantages are achieved by the embodiments disclosed herein. As a first advantage, the present embodiments facilitate a wider range of implant recipes for a given ion implanter by expanding the m/q range that may achieve a targeted final ion energy. As another advantage, the present embodiments facilitate changing operation of a linear accelerator between different power assembly configurations, operating at different frequencies without requiring modification of internal components within a linear accelerator vacuum enclosure.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An ion implanter, comprising:
an ion source and extraction system, arranged to generate an ion beam at a first ion energy; and
a linear accelerator, the linear accelerator being arranged to accelerate the ion beam to a second ion energy, greater than the first ion energy, wherein the linear accelerator comprises a plurality of acceleration stages that are coupled to receive a plurality of RF signals from a plurality of power assemblies, respectively, wherein the linear accelerator is configured wherein at least one stage of the plurality of acceleration stages is coupled to:
reversibly connect to a first power assembly, comprising a resonator that contains a resonator enclosure, the first power assembly generating a first RF signal at a first frequency;
to disconnect from the first power assembly; and
to connect to a second power assembly, generating a second RF signal at a second frequency, greater than the first frequency, while not changing the resonator enclosure.

2. The ion implanter of claim 1, wherein the at least one stage is arranged to reversibly couple to a 13.56 MHz power assembly, to a 27.12 MHz power assembly, or to a 40.68 MHz power assembly.

3. The ion implanter of claim 2, wherein the 13.56 MHz power assembly comprises a first resonator having a first size, and the 27.12 MHz power assembly comprises a second resonator having a second size, wherein the linear accelerator comprises a vacuum enclosure, wherein the vacuum enclosure extends along the plurality of acceleration stages,
wherein the vacuum enclosure is arranged to accommodate the 13.56 MHz power assembly at all of the plurality of acceleration stages, and wherein the vacuum enclosure is arranged to accommodate the 27.12 MHz power assembly at all of the plurality of acceleration stages.

4. The ion implanter of claim 1, wherein, in a first power assembly configuration, the linear accelerator is arranged to accelerate an ion beam having a m/q ratio in a range of 10-20 up to at least 2 MeV, and wherein, in a second power assembly configuration, the linear accelerator is arranged to accelerate a proton ion beam to at least 1.7 Me V ion energy.

5. The ion implanter of claim 4, wherein the first power assembly configuration comprises a set of power assemblies operating at 13.56 MHz, and wherein the power assembly configuration comprises a set of power assemblies operating at 27.12 MHz.

6. The ion implanter of claim 1, the linear accelerator further comprising at least one buncher, disposed upstream of the plurality of acceleration stages, and arranged to receive the ion beam as a continuous ion beam, and to output the ion beam as a bunched ion beam.

7. The ion implanter of claim 6, wherein the at least one buncher is coupled to reversibly connect to a first buncher power supply, generating a first buncher RF signal at a first buncher frequency, to disconnect from the first buncher power supply, and to connect to a second buncher power supply, generating a second buncher RF signal at a second buncher frequency, greater than the first buncher frequency.

8. The ion implanter of claim 6, the at least one buncher comprising:

a first buncher, coupled to receive a first buncher RF signal at a first buncher frequency, wherein the first buncher frequency is equal to the first frequency of the RF signal, applied to the at least one acceleration stage; and a second buncher, coupled to receive a harmonic RF signal at a harmonic frequency equal to twice the first buncher frequency.

9. The ion implanter of claim 1, wherein the resonator further comprises a loop driver, wherein the loop driver is not changed between the first power assembly and the second power assembly.

10. A linear accelerator for use in an ion implanter, comprising:

a vacuum enclosure, arranged to contain an ion beam;

a plurality of drift tube assemblies, arranged within the vacuum enclosure, wherein a given drift tube assembly of the plurality of drift tube assemblies defines a given acceleration stage of a plurality of acceleration stages of the linear accelerator;

a plurality of quadrupoles, arranged within the vacuum enclosure, wherein a given quadrupole is arranged at the given acceleration stage of the linear accelerator; and an interface for coupling to a set of external power assemblies, at the plurality of acceleration stages, wherein at least one acceleration stage is arranged to:

reversibly connect to a first power assembly, comprising a resonator that contains a resonator enclosure, the first power assembly generating an RF signal at a first frequency;

to disconnect from the first power assembly; and to connect to a second power assembly, generating a second RF signal at a second frequency, greater than the first frequency, while not changing the resonator enclosure.

11. The linear accelerator of claim 10, wherein the at least one acceleration stage is arranged to reversibly couple to a 13.56 MHz power assembly, to a 27.12 MHz power assembly, or to a 40.68 MHz power assembly.

12. The linear accelerator of claim 11, wherein the 13.56 MHz power assembly comprises a first resonator having a first size, and the 27.12 MHz power assembly comprises a second resonator having a second size, wherein the linear accelerator comprises a vacuum enclosure, wherein the vacuum enclosure extends along the plurality of acceleration stages, wherein the vacuum enclosure is arranged to accommodate the 13.56 MHz power assembly at all of the plurality of acceleration stages, and wherein the vacuum enclosure is arranged to accommodate the 27.12 MHz power assembly at all of the plurality of acceleration stages.

13. The linear accelerator of claim 10, the linear accelerator further comprising at least one buncher, disposed upstream of the plurality of acceleration stages, and arranged to receive the ion beam as a continuous ion beam, and to output the ion beam as a bunched ion beam.

14. The linear accelerator of claim 13, wherein the at least one buncher is coupled to reversibly connect to a first buncher power supply, generating a first buncher RF signal at a first buncher frequency, to disconnect from the first buncher power supply, and to connect to a second buncher power supply, generating a second buncher RF signal at a second buncher frequency, greater than the first buncher frequency.

15. The linear accelerator of claim 13, the at least one buncher comprising:

a first buncher, coupled to receive a first buncher RF signal at a first buncher frequency, wherein the first buncher frequency is equal to the first frequency of the RF signal, applied to the at least one acceleration stage; and a second buncher, coupled to receive a harmonic RF signal at a harmonic frequency equal to twice the first buncher frequency.

16. A method of operating an ion implanter, comprising:

accelerating a first ion species through an RF linear accelerator using a first power assembly configuration;

switching the RF linear accelerator to a second power assembly configuration; and accelerating a second ion species through the RF linear accelerator using the second power assembly configuration, wherein the first power assembly configuration comprises a first power assembly, comprising a resonator that includes a resonator enclosure, the first power assembly generating an RF signal at a first frequency, and wherein the second power assembly configuration comprises a second power assembly, generating a second RF signal at a second frequency, greater than the first frequency, wherein the RF linear accelerator is switched from the first power assembly configuration to the second power assembly configuration, without changing the resonator enclosure.

17. The method of claim 16, wherein the RF linear accelerator comprises a plurality of acceleration stages, wherein at least one stage of the linear accelerator is arranged to reversibly couple to a 13.56 MHz power assembly, to a 27.12 MHz power assembly, or to a 40.68 MHz power assembly.

18. The method of claim 17, wherein the 13.56 MHz power assembly comprises a first resonator having a first size, and the 27.12 MHz power assembly comprises a second resonator having a second size, wherein the linear accelerator comprises a vacuum enclosure, wherein the vacuum enclosure extends along the plurality of acceleration stages, wherein the vacuum enclosure is arranged to accommodate the 13.56 MHz power assembly at all of the plurality of acceleration stages, and wherein the vacuum enclosure is arranged to accommodate the 27.12 MHz power assembly at all of the plurality of acceleration stages.

19. The method of claim 17, the RF linear accelerator further comprising at least one buncher, disposed upstream of the plurality of acceleration stages, and arranged to receive the first ion species and the second ion species as a first continuous ion beam, and second continuous ion beam, respectively, and to output the first continuous ion beam and the second continuous ion beam as a first bunched ion beam, and a second bunched ion beam, respectively.

20. The method of claim 19, further comprising:

connecting the at least one buncher to a first buncher power supply, generating a first buncher RF signal at a first buncher frequency, to bunch the first ion species;

disconnecting from the first buncher power supply; and connecting the at least one buncher to a second buncher power supply, generating a second buncher RF signal at a second buncher frequency, greater than the first buncher frequency, to bunch the second ion species.

\* \* \* \* \*